United States Patent [19]

Shiohara et al.

[11] Patent Number: 5,404,313
[45] Date of Patent: Apr. 4, 1995

[54] SYSTEM FOR ASSIGNING POSITIONS OF BLOCK TERMINALS IN A VLSI

[75] Inventors: Takahiro Shiohara, Osaka; Masahiro Fukui, Matsubara, both of Japan

[73] Assignee: Matsushita Electric Industrial Co., Ltd., Osaka, Japan

[21] Appl. No.: 37,463

[22] Filed: Mar. 25, 1993

Related U.S. Application Data

[63] Continuation of Ser. No. 471,910, Jan. 29, 1990, abandoned.

[30] Foreign Application Priority Data

Jan. 31, 1989 [JP] Japan .................................. 1-21432

[51] Int. Cl.⁶ ............................................. G06F 15/60
[52] U.S. Cl. .................... 364/491; 364/490; 364/489; 364/488
[58] Field of Search ................ 364/488, 489, 490, 491

[56] References Cited

U.S. PATENT DOCUMENTS

| | | | |
|---|---|---|---|
| 3,629,843 | 12/1971 | Scheinman | 364/490 |
| 4,577,276 | 3/1986 | Dunlop et al. | 364/491 |
| 4,593,363 | 6/1986 | Burstein et al. | 364/491 |
| 4,839,821 | 6/1989 | Murakata | 364/491 |
| 4,908,772 | 3/1990 | Chi | 364/491 |

OTHER PUBLICATIONS

Eugene L. Lawler, "Combinatorial Optimization: Networks and Matroids", 1976, pp. 109–132.
Ulrich Ph. Lauter, "Top Hierarchical Global Routing For Channelless Gate Arrays Based on Linear Assignment", (1987).
"A Block Interconnection Algorithm for Hierarchical Layout System" by Fukui et al., IEEE Trans. on C.A.D., vol. CAD-6, No. 3, May 1987, pp. 383–390.
"Automatic Placement and Routing of Gate Arrays" by G. Robson, VLSI Design, vol. V, No. 4, Apr. 1984, pp. 35–43.
"A Routing Program Applicable to Various Chip Structures of Gate Arrays" by Terai et al., Joho Shori Gakkai, Ronbunshi, vol. 25, No. 3, May 1984, pp. 357–364.

*Primary Examiner*—Vincent N. Trans
*Attorney, Agent, or Firm*—Panitch Schwarze Jacobs & Nadel

[57] ABSTRACT

A system in which blocks are classified into one or more fixed shape blocks in which terminal positions are previously determined and one or more variable shape blocks in which terminal positions are changeable. The system includes an initial terminal assign section for provisionally assigning terminal positions relating to the variable shape blocks for the purpose of minimizing the total length of the wirings; and a terminal distribution and assign section for evaluating the provisionally assigned terminal positions and for distributing the provisionally assigned terminal positions on the basis of the evaluation.

10 Claims, 10 Drawing Sheets

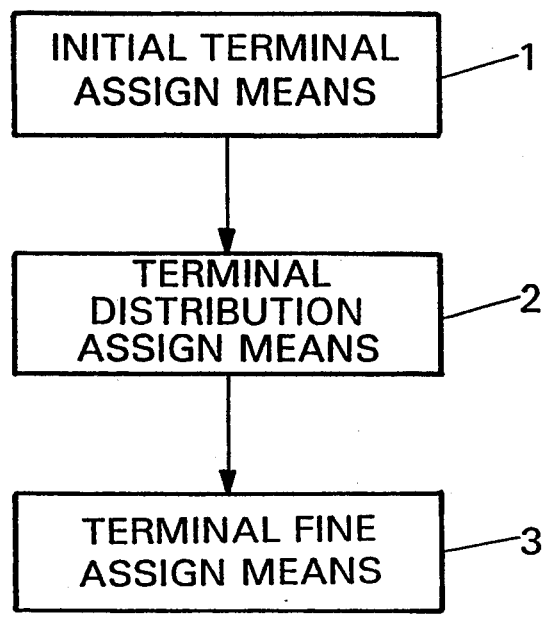
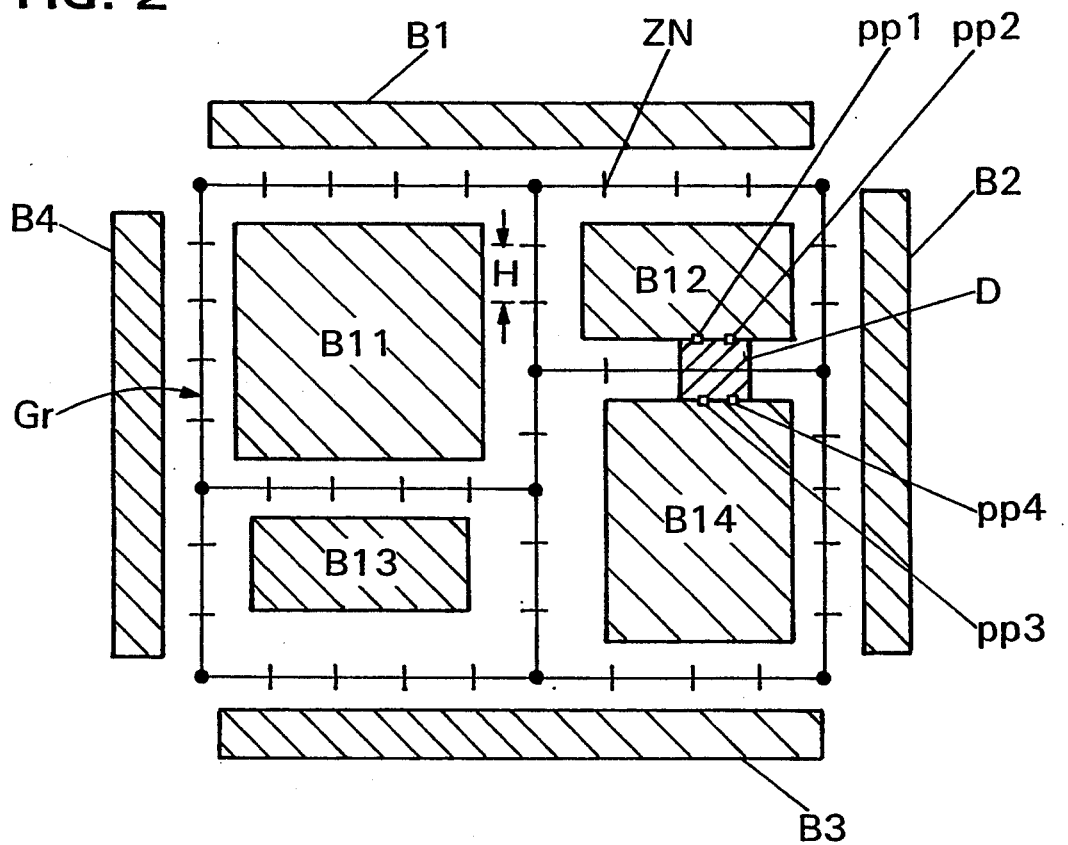

FIG. 10A
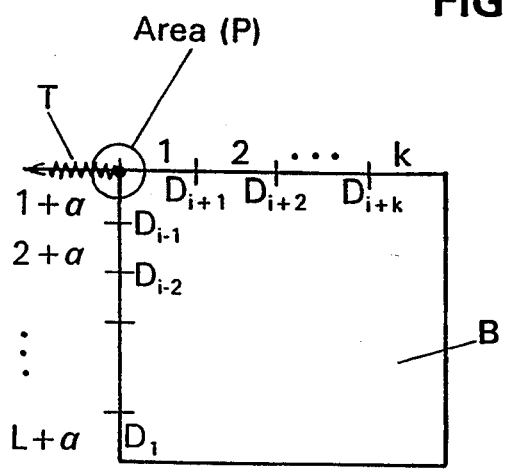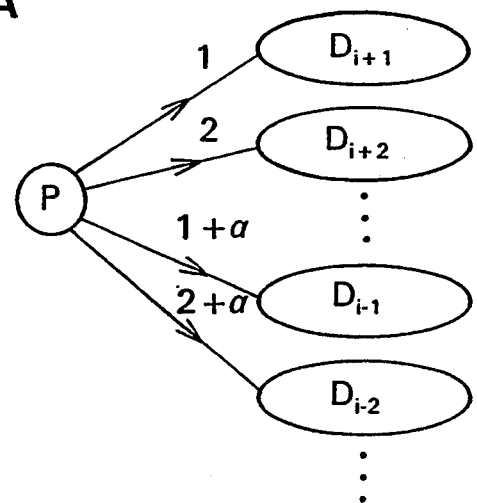
FIG. 10B
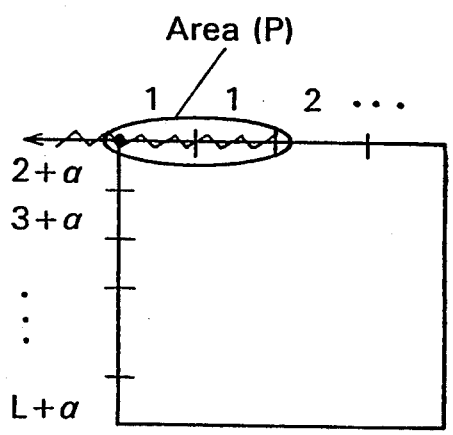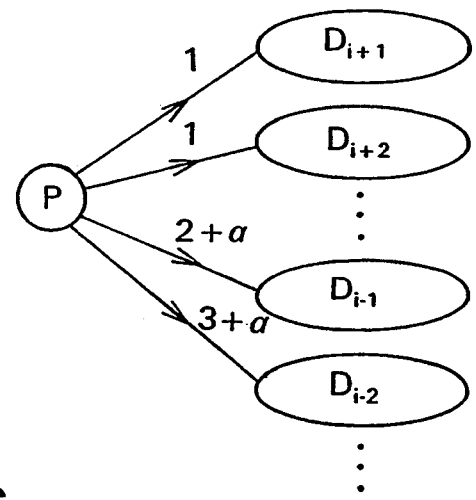
FIG. 10C
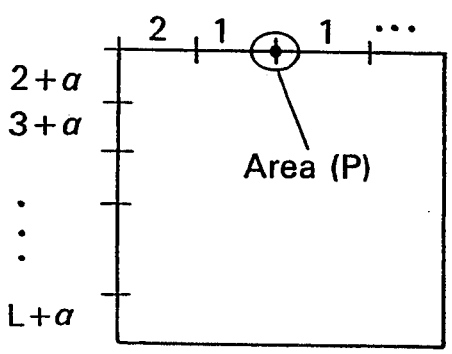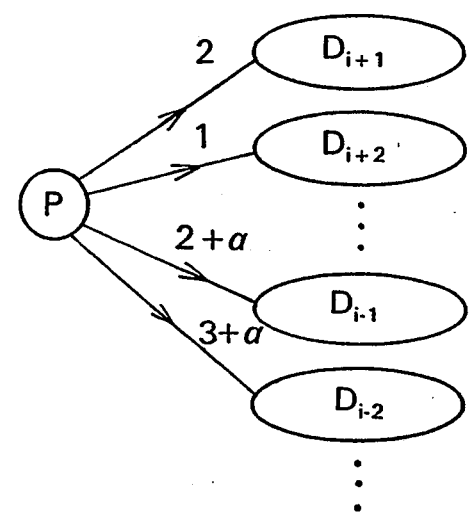

SYSTEM FOR ASSIGNING POSITIONS OF BLOCK TERMINALS IN A VLSI

This application is a continuation of U.S. Ser. No. 07/491,910, filed Jan. 29, 1990, now abandoned.

BACKGROUND OF THE INVENTION

1. Field of the Invention

This invention relates to a system for assigning block terminals, and more particularly to a system for optimizing block terminal positions when automatically designing a layout for a semiconductor device such as a VLSI.

2. Description of the Prior Art

In a semiconductor device such as a VLSI, generally, a plurality of blocks are disposed, and block terminals or pins are electrically connected via wirings. The assignment of the positions of such terminals is manually performed by a circuit designer while taking into account the connection of signals.

In the prior art, therefore, it is difficult to simultaneously satisfy the two requirements that the terminal positions are to be optimized to avoid the local concentration of the terminals and that the total wiring length is to be minimized. Furthermore, in a manual terminal location assignment process, such a problem is encountered that considerably increased manhours are required for designing the layout of a VLSI, creating the difficulty in reducing the designing period.

SUMMARY OF THE INVENTION

In a system for assigning positions of block terminals according to the invention, said terminals are connected through wirings, said system comprises: initial terminal assign means for provisionally assigning terminal positions for the purpose of minimizing the total length of said wirings; and terminal distribution and assign means for evaluating said provisionally assigned terminal positions, and for distributing said provisionally assigned terminal positions on the basis of said evaluation.

In a preferred embodiment, the system further comprises a terminal fine assign means for determining fine positions of said terminals.

In a preferred embodiment, the initial terminal assign means comprises: means for dividing an area used for forming said wirings into quantized areas; means for representing the length of a wiring connecting equipotential terminals by the number of quantized areas through which said wiring passes; and means for minimizing the length of each wiring.

In a preferred embodiment, the initial terminal distribution and assign means comprises: means for dividing an area at the periphery of each of said blocks into quantized areas; means for setting a first set of vertices which corresponds to a set of terminals of said block, means for setting a second set of vertices which corresponds to a set of said quantized areas; means for setting first directed edges from each of first vertices which belong to said first set to second vertices which belong to said second set and to which a terminal corresponding to said first vertex can be assigned, to each Of which a cost is added, said cost being at a minimum when said terminal is assigned to said provisional terminal position, said cost increasing in accordance with one or more predetermined conditions; means for setting second directed edges from a third vertex to each of said first vertices, the flow capacity of said second directed edge being 1; means for setting third directed edges from each of said second vertices to a fourth vertex, the flow capacity of said third directed edge being the maximal number of terminals which can be assigned to said quantized area; means for determining a flow from said third vertex to said fourth vertex in which the flow is an integer, the cost is minimized, and the flow is maximized; and means for obtaining terminal assignment which corresponds to directed edges between said first vertices and said second vertices and having a flow of 1.

In a preferred embodiment, the predetermined conditions include one or more of the followings: the distance from said provisional terminal position; whether inside or outside the minimum rectangle which enclose a wiring between e set of equipotential terminals including said terminal; the number of bends of said wiring; the distance with respect to previously assigned one or more terminals of adjacent blocks which are connected equipotentially to said terminal; and whether on one edge of said block or on another edge, said one edge corresponding to said provisional terminal position.

In a system for assigning positions of terminals of blocks according to the invention, said terminals is connected through wirings, said blocks is classified into one or more fixed shape blocks in which terminal positions are previously determined and one or more variable shape block in which terminal positions are changeable, said system comprises: initial terminal assign means for provisionally assigning terminal positions relating to said variable shape blocks, in the purpose of minimizing the total length of said wirings; and terminal distribution and assign means for evaluating said provisionally assigned terminal positions, and for distributing said provisionally assigned terminal positions on the basis of said evaluation.

In a preferred embodiment, the system further comprises a terminal fine assign means for determining fine positions of said terminals.

In a preferred embodiment, the initial terminal assign means comprises: means for dividing an area for forming said wirings into quantized areas; means for representing the length of a wiring connecting equipotential terminals by the number of quantized areas through which said wiring passes; and means for minimizing the length of each wiring.

In a preferred embodiment, the terminal distribution and assign means comprises: means for dividing an area at the periphery of each of said blocks into quantized areas; means for setting a first set of vertices which corresponds to a set of terminals of said block, means for setting a second set of vertices which corresponds to a set of said quantized areas; means for setting first directed edges from each of first vertices which belong to said first set to second vertices which belong to said second set and to which a terminal corresponding to said first vertex can be assigned, to each of which a cost is added, said cost being minimum when said terminal is assigned to said provisional terminal position, said cost increasing in accordance with one or more predetermined conditions; means for setting second directed edges from a third vertex to each of said first vertices, the flow capacity of said second directed edge being 1; means for setting third directed edges from each of said second vertices to a fourth vertex, the flow capacity of said third directed edge being the maximal number of terminals which can be assigned to said quantized area; means for determining a flow from said third vertex to said fourth vertex in which the flow is an integer, the cost is minimized, and the flow is maximized; and means for obtaining terminal assignment which corresponds to directed edges between said first vertices and said second vertices and having a flow of 1.

In a preferred embodiment, the predetermined conditions includes one or more of the followings: the distance from said provisional terminal position; whether inside or outside the minimum rectangle which enclose a wiring between a set of equipotential terminals including said terminal; the number of bends of said wiring; the distance with respect to previously assigned one or more terminals of adjacent blocks which are connected equipotentially to said terminal; and whether on one edge of said block or on another edge, said one edge corresponding to said provisional terminal position.

In a system for assigning positions of terminals of blocks, said terminals are connected through wirings, said wiring is formed in the area which is between said blocks, said system comprises: means for dividing said area for said wirings into quantized areas; and means for restricting the number of terminals which can be assigned to each of said quantized areas.

A system for assigning positions of block terminals according to the invention, comprises: means for dividing an area at the periphery of each of said blocks into quantized areas; means for setting a first set of vertices which corresponds to a set of terminals of said block, means for setting a second set of vertices which corresponds to a set of said quantized areas; means for setting first directed edges from each of first vertices which belong to said first set to said second vertices which belong to said second set, to each of which a cost is added, said cost representing a usefulness specification for assigning a terminal to a quantized area, the flow capacity of said first directed edge being 1; means for setting second directed edges from a third vertex to. each of said first vertices, the flow capacity of said second directed edge being 1; means for setting third directed edges from each of said second vertices to a fourth vertex, the flow capacity of said third directed edge being the maximal number of terminals which can be assigned to said quantized area means for determining a flow from said third vertex to said fourth vertex in which the flow is an integer, the cost is minimized, and the flow is maximized; and means for obtaining terminal assignment which corresponds to directed edges between said first vertices and said second vertices and having a flow of 1.

In a system for representing the position of a terminal in the periphery of a rectangular block according to the invention, said position is represented by a real number j, and the center of said block is represented by a real number a, when said terminal is on a first edge of said block, said position is separated from one end of said first edge by $(j-a)/b$, where $a < j \leq a+b$, and b is a real number, when said terminal is on a second edge of said block connected to said first edge, said position is separated from one end of said second edge connected to the other end of said first edge by $(j-a-b)/b$, where $a+b < j \leq a+2b$, when said terminal is on a third edge of said block connected to said second edge, said position is separated from one end of said third edge connected to the other end of said second edge by $(j-a-2b)/b$, where $a+2b < j \leq a+3b$, and when said terminal is on a fourth edge of said block connected to said third edge, said position is separated from one end of said fourth edge connected to the other end of said third edge by $(j-a-3b)/b$, where $a+3b < j \leq a+4b$.

Thus, the invention described herein makes possible the objectives of:

(1) providing a system for assigning block terminals by which both the two requirements of the optimization of terminal positions and the minimization of the total wiring length can be simultaneously satisfied;
(2) providing a system for assigning terminals of blocks which can be performed automatically;
(3) providing a system for assigning terminals of blocks by which positions of terminals can be rapidly determined; and
(4) providing a system for representing the position of a terminal in a block which is useful in calculation.

BRIEF DESCRIPTION OF THE DRAWINGS

This invention may be better understood and its numerous objects and advantages will become apparent to those skilled in the art by reference to the accompanying drawings as follows:

FIG. 1 is a flowchart illustrating an embodiment of the invention.

FIG. 2 illustrates the wiring graph and division areas used in the embodiment of FIG. 1.

FIGS. 10A to 10D illustrate diagrammatically the way of adding a cost.

DESCRIPTION OF THE PREFERRED EMBODIMENTS

Figure 12:
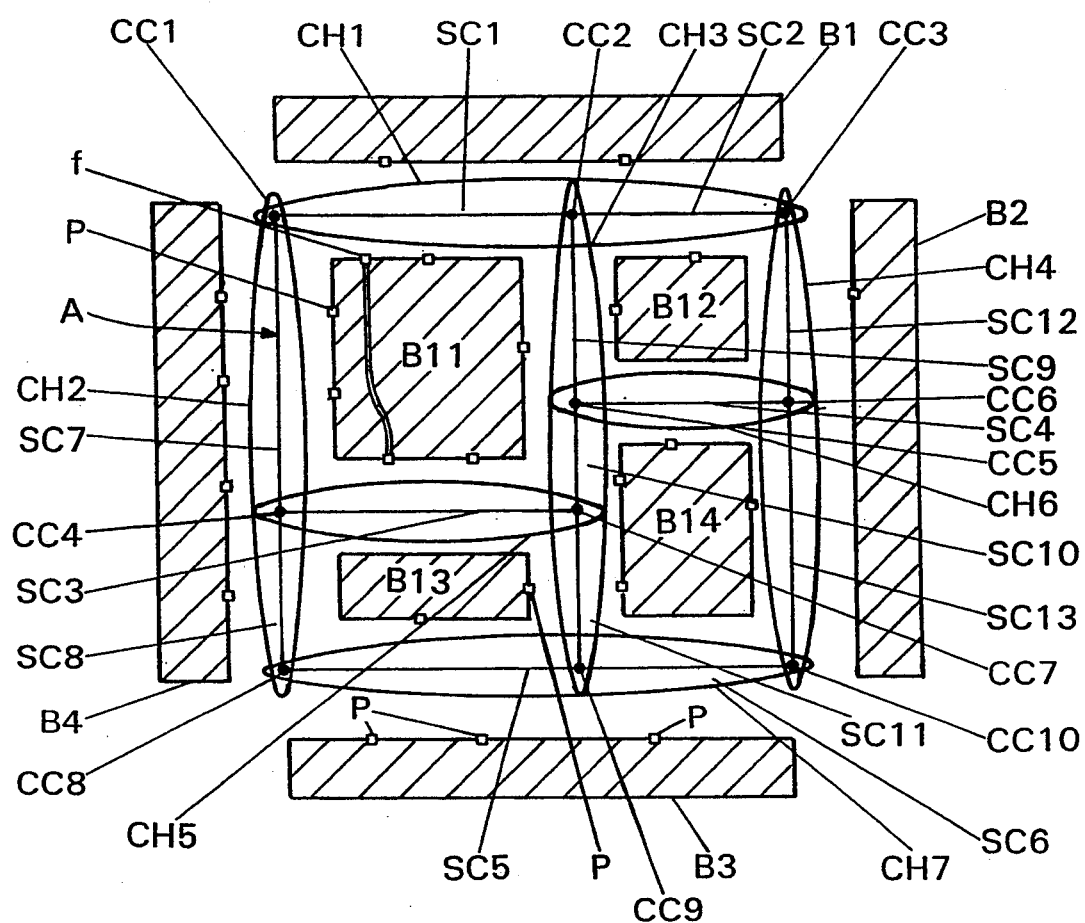
FIG. 12 is a diagram illustrating a block assignment on a VLSI chip.

FIG. 12 shows a layout model of a VLSI which is processed by a system according to the invention. The VLSI chip shown in FIG. 12 is provided with four I/O blocks B1-B4 disposed respectively in the vicinity of edges of the chip and surrounding a rectangular area in which rectangular blocks B11-B14 are formed. The I/O blocks B1-B4 have one or more terminals p which are disposed at one edge. The blocks B11-B14 are different in size and shape, and each block has a plurality of terminals P which are disposed at edges, and optionally one or more feed-throughs f. The feed-throughs f are wiring patterns passing over a block from one edge to the opposite edge.

In this embodiment, it is assumed that two terminals (referred to as "feed-through terminals") defining the positions where a feed-through passes opposite edges of a block are to be disposed at the edges. The blocks B11-B14 are classified into two groups, one group consists of blocks in which the shape is variable and the numbers and positions of terminals feed-throughs can be freely selected (such a block is referred to as "a variable shape block"), and the other group consists of blocks in which the shape and the numbers and positions of terminals and feed-throughs are previously determined (such a block is referred to as "a fixed shape block").

A set of terminals which are to be connected equipotentially to each other is referred to as "a net". In the following description, each terminal is provided with the name of a net to which the terminal belongs. Wirings are performed using wiring regions formed between blocks, and feed-throughs, so as to constitute predetermined nets. The change of terminal placement causes the changes in the areas of blocks, and the total wiring length, resulting in seriously affecting the chip size. Consequently, the terminal assignment is performed with the objects of the minimized chip area and the shortest total wiring length, while considering the density of terminals.

Wirings connecting terminals are formed in band-like areas between blocks B1–B4 and B11–B14. These band-like areas can be represented by subchannels SC1–SC13, and two or more of these subchannels meet at channel crosses CC1–CC10. The subchannels SC1–SC13 are edges of channel graphs A the vertices of which are the channel crosses CC1–CC10. A band-like wiring area formed by combining subchannels which continue in one direction is referred to as a channel. In FIG. 12, there are seven channels CH1–CH7. The channel graph A represented by a set of channels is called a channel structure.

In this system, as shown in FIG. 2, the subchannels SC1–SC13 of the channel graph A are divided into equal intervals H (quantization), and the dividing portions of the subchannels are referred to as vertices ZN. Such a graph is called a wiring graph Gr. The portions of the wiring area corresponding to respective edges of the wiring graph Gr are called division area D to which terminals are assigned. First, terminals of a block are assigned to one of the division areas surrounding the block. The upper limit number of terminals in the same block which can be assigned to each division area is called a terminal assignment capacity. The number of terminals assigned to one division area is designated as a terminal assignment density.

Figure 3:
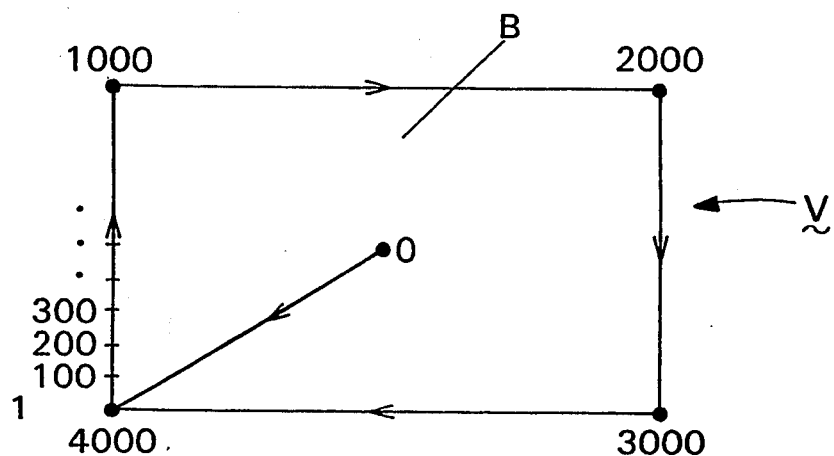
FIG. 3 illustrates the coordinate of the terminal assignment.

It is assumed that one of the blocks B to be considered has a rectangular shape. As shown in FIG. 3, a coordinate system V is created for the block B. In the coordinate system V, the relative position of a terminal with respect to the block B is represented by an integer from 0 to 4,000 (where "0" represents the center of the block B). A terminal position on the left side of the block B is represented by an integer j where $1 \leq j \leq 1000$. A terminal position j means that the terminal is disposed at the position of j/1000 from the bottom on the left block side. Relative positions on the upper, right and lower sides are represented in a similar manner by integers from 1,001 to 2,000, from 2,001 to 3,000 and from 3,001 to 4,000, respectively.

Each of the terminals assigned to the division area is finally assigned to a closest point around the block B, and the positions of the terminals are represented by the relative position from 1 to 4,000. The coordinate system V can represent the relative terminal position with respect to the block, even when the aspect ratio of the block B is changed. The coordinate system may be rotated, or mirror-inverted.

This embodiment can be applied to the two situations, rough and fine deciding stages of the floor plan, thereby gradually improving the floor plan. In respective situations, as a precondition of the invention, indexes for arranging blocks and avoiding the concentration of terminals are given. Generally, in the terminal assignment, an important aspect is not only to minimize the area of a VLSI chip and the total wiring length but also to avoid the local concentration of the terminals. According to the embodiment, the terminal and feed-through assignment is obtained for the purpose of obtaining the terminal position which minimizes the virtual total wiring length under the condition that the terminal assignment density in each division area does not exceed a predetermined upper limit (terminal assignment capacity).

A first embodiment of the invention will be described. FIG. 1 illustrates diagrammatically this embodiment which comprises an initial terminal assign means 1, a terminal distribution assign means 2, and a terminal fine assign means 3. In the following, processes in these means 1–3 will be illustrated.

[The initial terminal assign means 1]

The initial terminal assign means 1 obtains the terminal assignment wherein a terminal assignment capacity is neglected and only the minimization of the wiring length is considered. When a channel structure is given, the initial terminal assignment is performed as follows.

<Process of Initial Arrangement>

Step 1: Preparing Wiring Graph Gr'

Figure 4A:
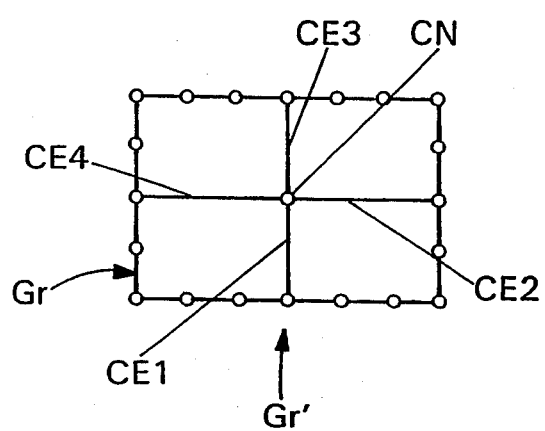
FIG. 4A is a wiring graph illustrating a variable shape block.
Figure 4B:
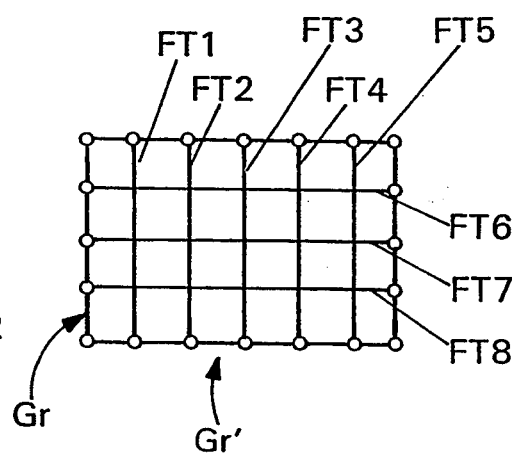
FIG. 4B is a wiring graph illustrating feed-throughs.

In the initial terminal assigning means 1, the wiring graph Gr is modified to form a modified wiring graph Gr' in order that the search is conducted in the wiring area and feed-throughs in a variable shape block. First, the wiring area is represented by the wiring graph Gr. As shown in FIG. 4A, a vertex CN is added at the center of a plane corresponding to a variable shape block. From the vertex CN, edges CE1–CE4 extend to vertices in the wiring graph Gr which are closest to the centers of each sides of the block. Furthermore, as shown in FIG. 4B, edges FT1–FT8 connecting vertices on the edges opposite to each other are added to represent possible feed-throughs. The edges FT1–FT8 are used for obtaining the edges whereon the feed-through terminals are to be located. A capacity CP indicating the maximal number of feed-throughs which can pass through the edges is assigned to the edges. The capacity CP is given by $0.5 \times (N - |P|/T)$ where $|P|$ is the number of block terminals, T is the number of division areas, and N is the number of terminals assignable to each division area. To a plane corresponding to a fixed shape block, only the edge corresponding to the feed-through terminal is added. In this way, the modified wiring graph Gr' is prepared.

Each edge of the wiring graph Gr' is provided with a weight as follows. The weight of the edge corresponding to the wiring area between the blocks is given by (the length H of the division area corresponding to the edge)$\times (1 + K.C)$ where $K = 1/(10.N)$, $C = k.n.(W/W_{min})$, N is the total number of the nets, W is the width of the wiring path, $W_{min}$ is the minimum width of the wiring, n is the number of nets passing the corresponding division area, and k is a parameter for controlling the relationship between the wiring width and the number of the passing nets. The weight of the edges CE1–CE4 connecting the center with the block periphery is given by (Manhattan distance from the center to the circumferential point)$\times$ a where a is a parameter for giving a penalty so as to make a search tree for obtaining the terminal assignment difficult to pass through a variable shape block. The weight of the edges corresponding to the feed-throughs FT1–FT8 is given by (the length of feed-through)×(b+K.C)

where b is a parameter for giving a penalty so as to make the search tree for obtaining the terminal assignment difficult to pass through the feed-through. In the embodiment, the penalties a and b are both set to 1.1.

In a variable shape block, the initial positions of terminals which have not yet been assigned are set to the vertex CN corresponding to the center of the block. The initial positions of terminals of a variable shape block which have been assigned and those of terminals of a fixed shape block are set to vertices on the graph Gr' which are closest to the corresponding terminal. Respective terminals are ultimately assigned to any of the vertices on the block periphery, and nets passing through the feed-through are assigned to the edge representing the feed-through.)

Step 2: Executing the following processes for each net in ascending order of the size of the rectangles surrounding the net.

Figure 5A:
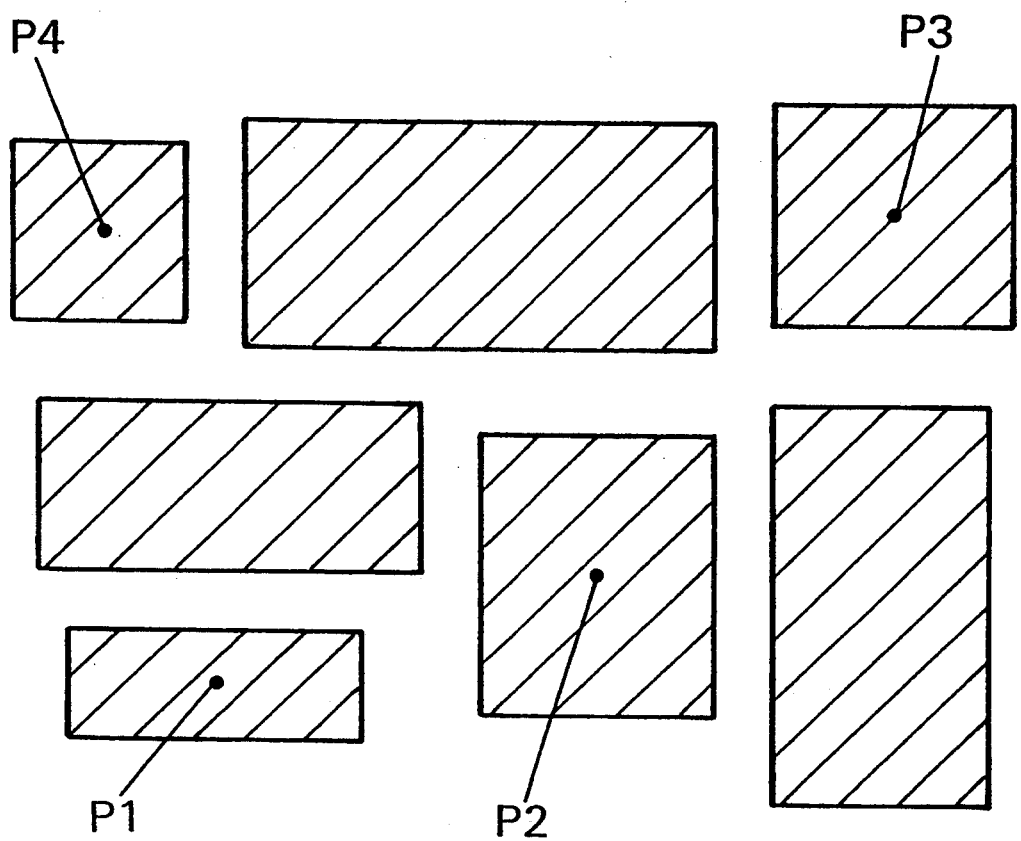
FIG. 5A is a diagram illustrating terminals.
Figure 5B:
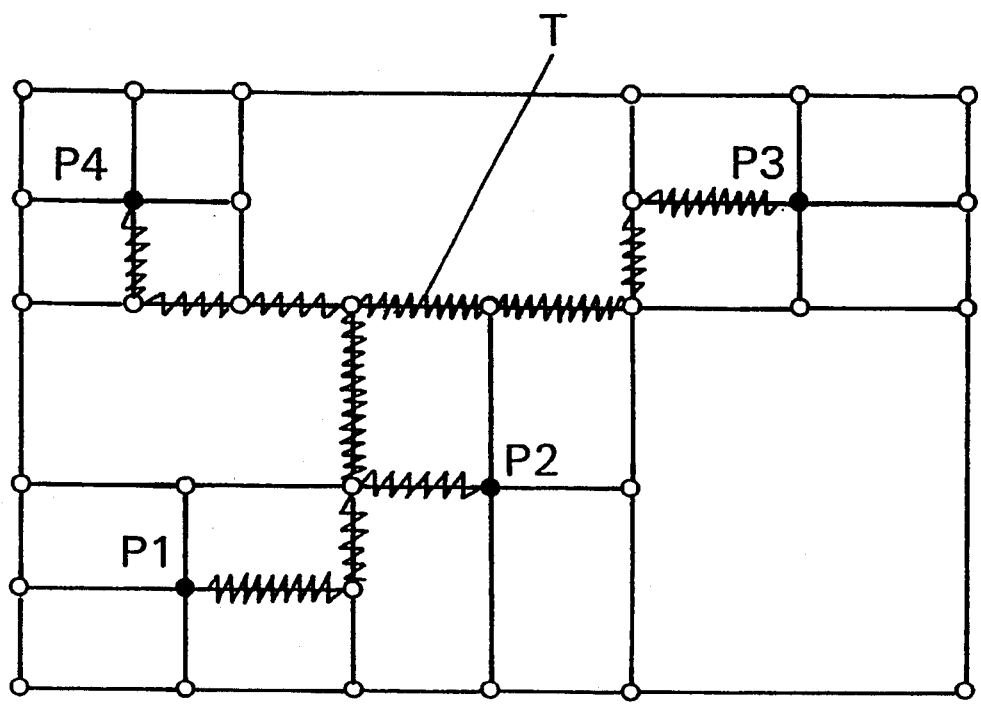
FIG. 5B is a diagram illustrating a Steiner tree.

(1) Obtain a Steiner tree T of the terminals P1–P4 on the graph Gr', as shown in FIG. 5B. FIG. 5A shows a block assignment and the terminals P1–P4 belonging to a net. An algorithm used for obtaining the Steiner tree T is described in "New Algorithms for Steiner Tree on Graphs" (Nang-Ping Chen, IEEE ISCAS/83, 1983).

Figure 5C:
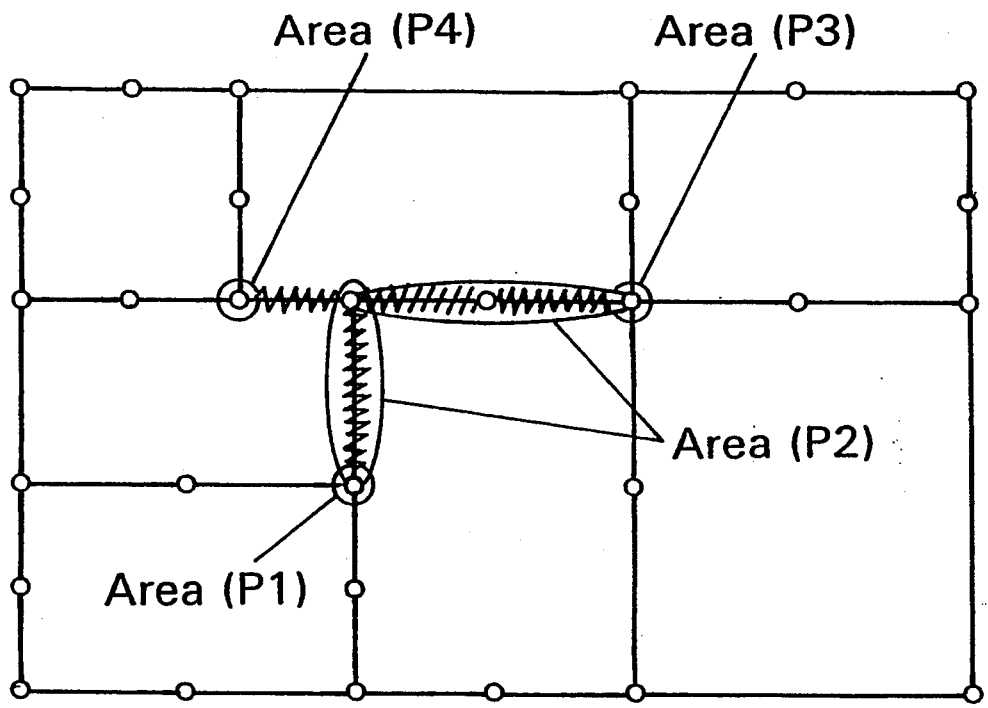
FIG. 5C is a diagram illustrating the process of removing edges from the Steiner tree shown in FIG. 5B.

(2) Repeat the following processes till all edges to be removed are removed from the Steiner tree T, as shown in FIG. 5C. Find a vertex v which is a leaf of the Steiner tree T, and an edge connected to the vertex v (the edge is denoted as e, and the other vertex of the edge e is indicated as u). When both the vertices v and u are those in the same block or corresponding to the peripheral area of the same block, delete the edge e=(v, u).

(3) Determine the initial positions of the terminals P1–P4 included in the nest, as the Areas (P1) to (P4) occupied by the Steiner tree T around the blocks including the terminals P1–P4 are designated, respectively.

[The terminal distribution assign means 2]

In the terminal distribution assign means 2, a terminal assignment capacity is defined to improve the assignment for distributing a terminal assignment density.

In the initial assignment, since only the minimization of the wiring length was considered, the terminals are concentrated locally, and there are some division areas in which the number of terminals exceeds the terminal assignment capacity. In the distributing stage, it is intended to distribute the terminal assignment by moving some terminals so as to bring the number of terminals assigned to respective division areas below the terminal assignment capacity. In moving the terminals from the initial assignment, it is essential to select carefully terminals to be moved, the moving direction, and the moving distance, and to consider whether terminals are to be fixed in the initial assignment or not. In this embodiment, the followings are considered.

(1) Terminals belonging to critical nets, which are designated by a circuit designer and required to be wired with a minimum length, are assigned preferentially to the initial assignment rather than those belonging to the other nets.

Figure 6:
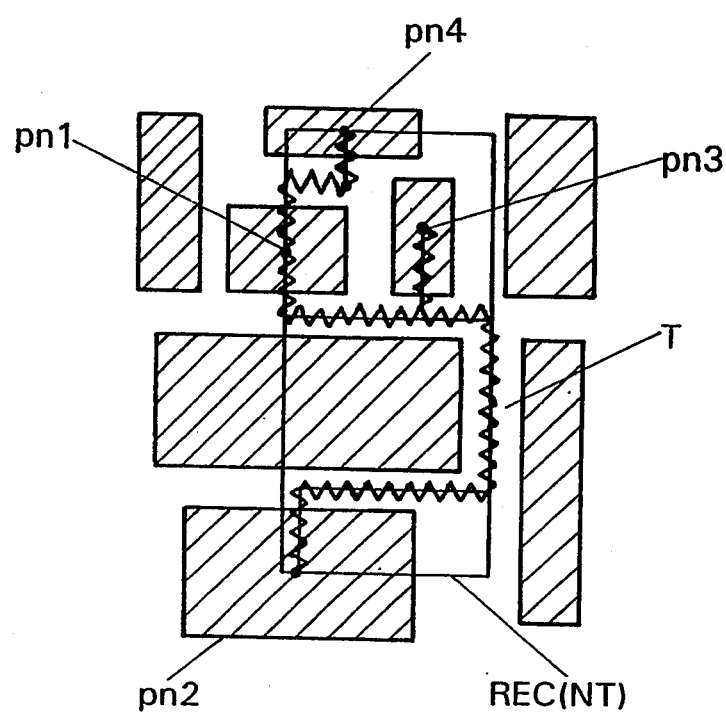
FIG. 6 is a diagram illustrating a rectangle which encloses all terminals and wirings included in a net.

(2) FIG. 6 shows a rectangle REC(NT) surrounding a Steiner tree T which relates to the net NT including the terminals pn1–pn4. The terminals pn1, pn2 and pn4 which are on the periphery of the rectangle REC(NT) exert much influence on the wiring length of the net NT as compared with the terminal pn3 which is inside the rectangle. Therefore, the terminals pn1, pn2 and pn4 are assigned preferentially to the division area within the rectangle REC(NT).

Figure 7A:
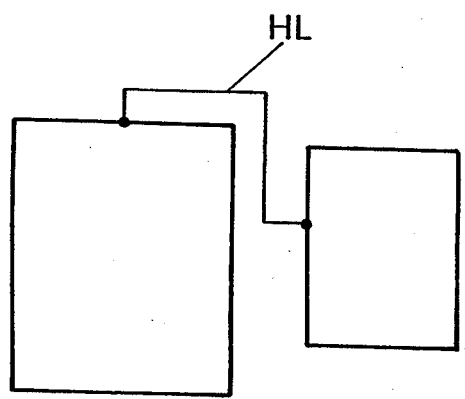
FIGS. 7A and 7B illustrate the number of bends in wirings.
Figure 7B:
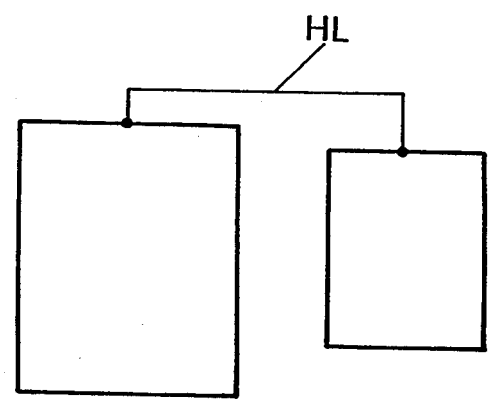

(3) The terminal assignment in which the number of bends in the wiring is a minimum has priority. In the examples shown in FIGS. 7A and 7B, the bend of the wiring HL in FIG. 7A is one, and that in FIG. 7B is zero. In this case, hence, the terminal assignment corresponding to the wiring of FIG. 7B is more preferable.

(4) When two terminals are assigned to a division area on the same subchannel in one net, the assignment is adjusted so that the coordinates of these terminals coincide with each other.

Figure 8:
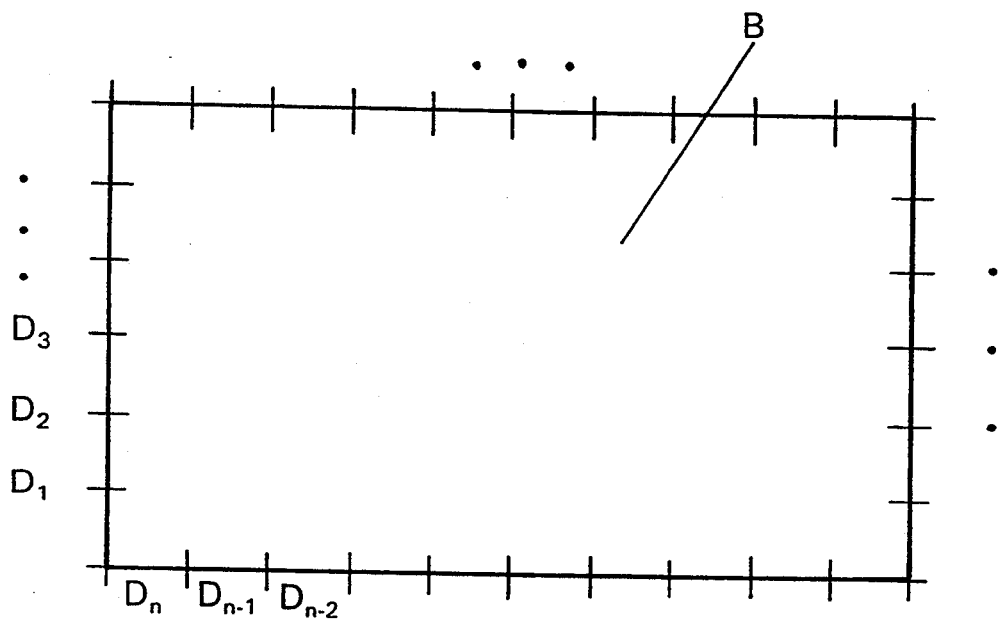
FIG. 8 is a diagram illustrating division areas.
Figure 9:
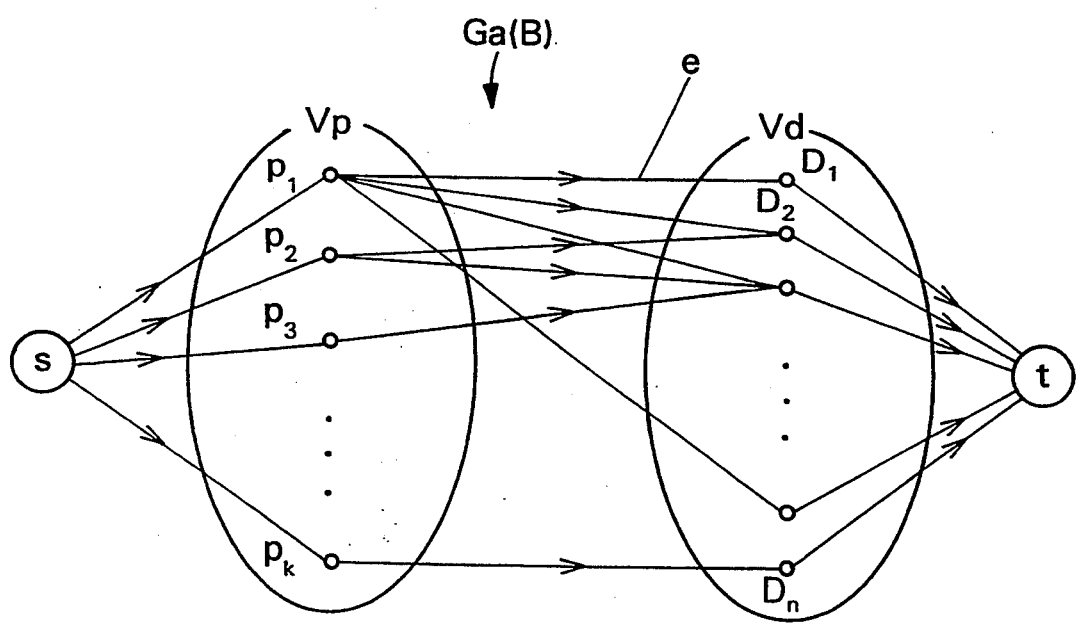
FIG. 9 is a diagram illustrating a directed graph.

In this terminal distribution assign process, the priority of assignment of each terminal included in the block B to an area of the division areas $D_1, D_2, \ldots, D_n$ on the periphery of the block B (FIG. 8), and the number of terminals assignable to each division area are represented by using a directed graph Ga(B) as shown in FIG. 9. One graph Ga(B) is defined for each block B. The graph Ga(B) comprises a vertex set $V_p = \{p_1, p_2, \ldots, p_k\}$ elements of which correspond respectively to the terminals to be assigned, another vertex set $V_d = \{D_1, D_2, \ldots D_n\}$ elements of which correspond respectively to the division areas of the block B, and virtual vertices s and t.

Directed edges e which are added to the graph Ga(B) will be described. Each directed edge e has a capacity c(e) as an attribute. Only when the terminal corresponding to the vertex $P_i$ can be assigned to the division area corresponding to the vertex $D_j$, a directed edge $e_{ij} = (P_i, D_j)$ is added from the vertex $p_i$ to the vertex $D_j$, and a capacity $c(e_{ij}) = 1$ is given. Directed edges $e_{si} = (s, P_i)$ are drawn from the vertex s to each of the vertices $p_i$ of the vertex set $V_p$, and a capacity $c(e_{si}) = 1$ is given. Directed edges $e_{jt} = (D_j, t)$ are drawn from each of the vertices $D_j$ of the vertex set $V_d$ to the vertex t, and a capacity $c(e_{jt})$ is given as a difference between the number of terminals assignable to the division area corresponding to $D_j$ and the number of feed-through terminals which have been assigned to the division area corresponding to $D_j$.

When there exist directed edges toward all of the vertices included in the set $V_d$ from each vertices included in the set $V_p$, and when the capacity of the directed edge toward t from the vertex of the set $V_d$ is sufficiently large, the solution of the problem of a maximal integer flow from the vertex s to the vertex t in the graph Ga(B) corresponds to the determination of the division area to which each terminals are assigned. A flow which satisfies the requirement that the amount of flow of an edge is less than the capacity is called a feasible flow, and the feasible flow having an amount of flow of the greatest integer among those having an amount of flow of an integer is called the maximal integer flow (Eugene L. Lawler. "Combinatorial Optimization: Networks and Matroids", HOLT. REINHART AND WINSTON, 1976). That is, in the solutions of the problem of the maximal integer flow from the vertex s to the vertex t, there exists a sole directed edge e from each vertex p (corresponding to each of the terminals P) and having a flow of 1. The terminal p is assigned to the division area D corresponding to the vertex D which is connected to the directed edge e from the vertex P. In an actual calculation, a cost in which the above-mentioned priority is considered is added to each directed edge, and the minimum cost maximal integer flow is obtained, thereby obtaining the terminal assignment in which the assignment priority is taken into account.

In this way, in the distributing and assigning procedure performed by the terminal distribution assign means 2, a cost representing the assignment priority of terminals to a division area is obtained for every block to be added to a directed edge $e_{ij}$, and a problem of minimum cost maximal-integer flow is solved, thereby obtaining the terminal assignment. The sequence of blocks to which the process of terminal assignment is performed is in a descending order of the total number of terminals fixed in the other blocks presenting in the division areas surrounding the blocks.

<Process of Distribution Arrangement>

Step 1: Obtaining the total number Fp(D) of fixed terminals for each division area of the wiring graph Gr', in the following procedures.

(1) Fp(D) for each division area is initialized to be set to 0.

(2) For a division area to which each terminal in a fixed shape block including the peripheral I/0 blocks belongs, Fp( D )=Fp(D)+1.

Step 2: Repeating following steps S2-1 to S2-4 till there exists no variable shape block which has not yet been processed.

Step S2-1: Among variable shape blocks B, the one having the maximal sum of the values Fp of the peripheral division areas surrounding the block is selected. The vertices of the graph Ga(B) are constructed by a vertex set $V_p = \{P_1, P_2, \ldots, P_k\}$ elements of which correspond respectively to the terminals to be assigned, another vertex set $V_d = \{D_1, D_2, \ldots, D_n\}$ elements of which correspond respectively to the division areas of the block, and virtual vertices s and t. A directed edge $e_{si} = (s, p_i)$ is added from the vertex s to the vertices $p_i$ of the set $V_p$, and a capacity $c(e_{si}) = 1$ is given. Directed edges $e_{jt} = (D_j, t)$ are drawn from each of the vertices $D_j$ of the set $V_d$ to the vertex t, and a capacity $c(e_{jt})$ is given as a difference between the number of terminals assignable to the division area corresponding to $D_j$ and the number of feed-through terminals assigned to the division area corresponding to $D_j$.

Step S2-2: Setting edges and costs as follows, based on the division areas to which the terminals have been initially assigned.

(1) When the initial assignment Area(P) of the terminal p is the end point or corner of the block B, as shown in FIG. 10A, the cost of the edge corresponding to the assignment to the division area $D_1$ in which the end point is included is set to 1. The cost of a division area to be considered is increased by 1 with every increase of the distance between the division area and the division area $D_1$. In order to take into consideration a bend of the wiring, $\alpha$ is also added to the cost of the edge directing to the division areas on the side different from the direction in which the edge of the Steiner tree T obtained by the initial terminal assign means is connected to the block.

(2) When, as shown in FIG. 10B, the initial assignment Area(P) of the terminal p is an area such as the initial assignment Area(P2) in FIG. 5C, the cost of the edge corresponding to assignment to the division area $D_j$ included in the area is set to 1. Further, $\alpha$ is also added to the cost of the edge directing to the vertex corresponding to the division areas on the edge different from the edge in which the area is included.

(3) When the initial assignment Area(P) of the terminal p is a point on the edge, as shown in FIG. 10C, the cost of the edge corresponding to assignment to the division area $D_j$ in which the point is included is set to 1. Further, $\alpha$ is also added to the cost of the edge directing to the vertex corresponding to the division areas on the edge different from the edge in which the area is included.

(4) When the terminal p is included in a two-terminal net and the other terminal q to be connected is fixed to a division area $D_i$ in the vicinity of the block B, the cost of the edge for the division area $D_i$ is set to 1. The cost of the edge for another division area is increased by 1 with every increase of the distance between the division area $D_i$ and the other division area.

Figure 10D:
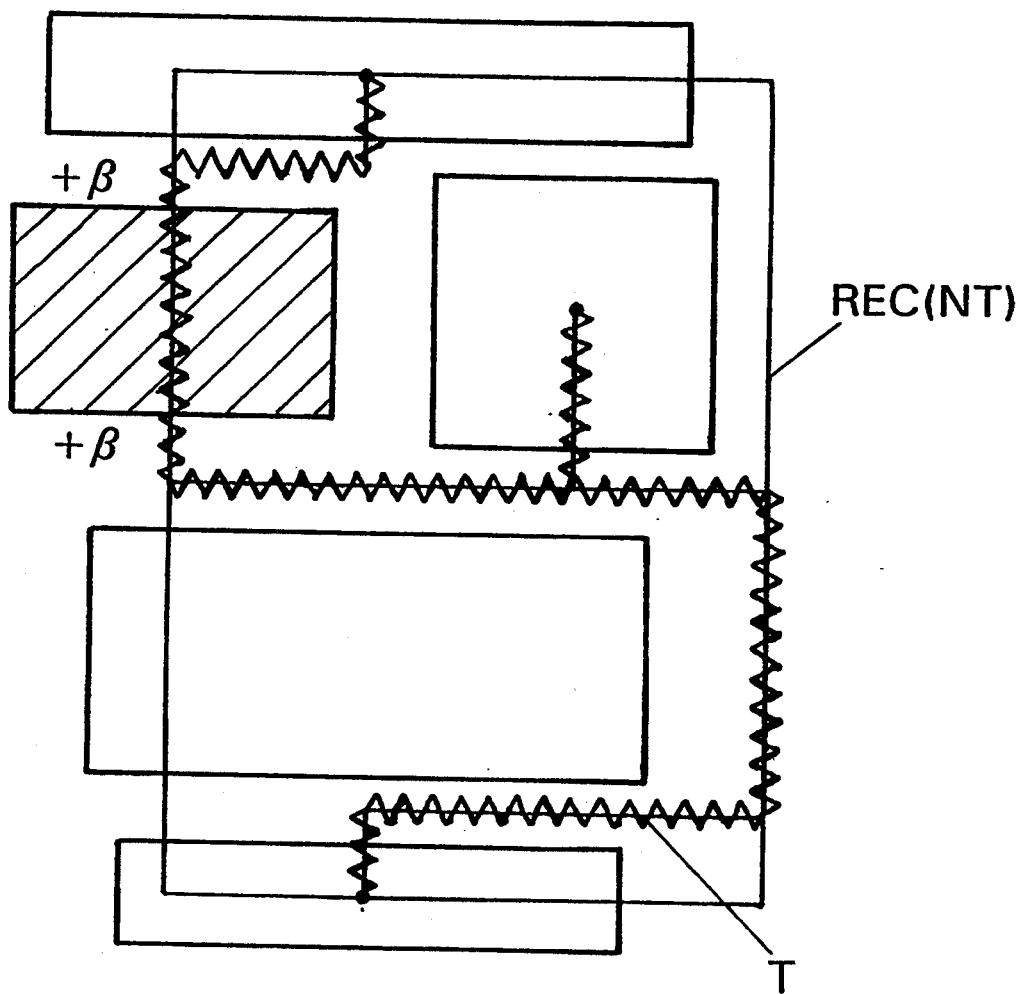

(5) As shown in FIG. 10D, $\beta$ is further added to the cost corresponding to assignment to a division area outside the rectangular surrounding the Steiner tree T relating to the net NT to which the questioned terminal belongs.

Step S2-3: Obtaining the minimum cost maximal integer flow for the graph Ga(B), and allocating terminals on the basis of edges having the flow of 1 among edges directing from the vertices of the set $V_p$ to those of the set $V_d$.

Step S2-4: For the division area D to which each terminal in the block B belongs, Fp(D)=Fp(D)+1.

[The terminal fine assign means 3]

Figure 11:
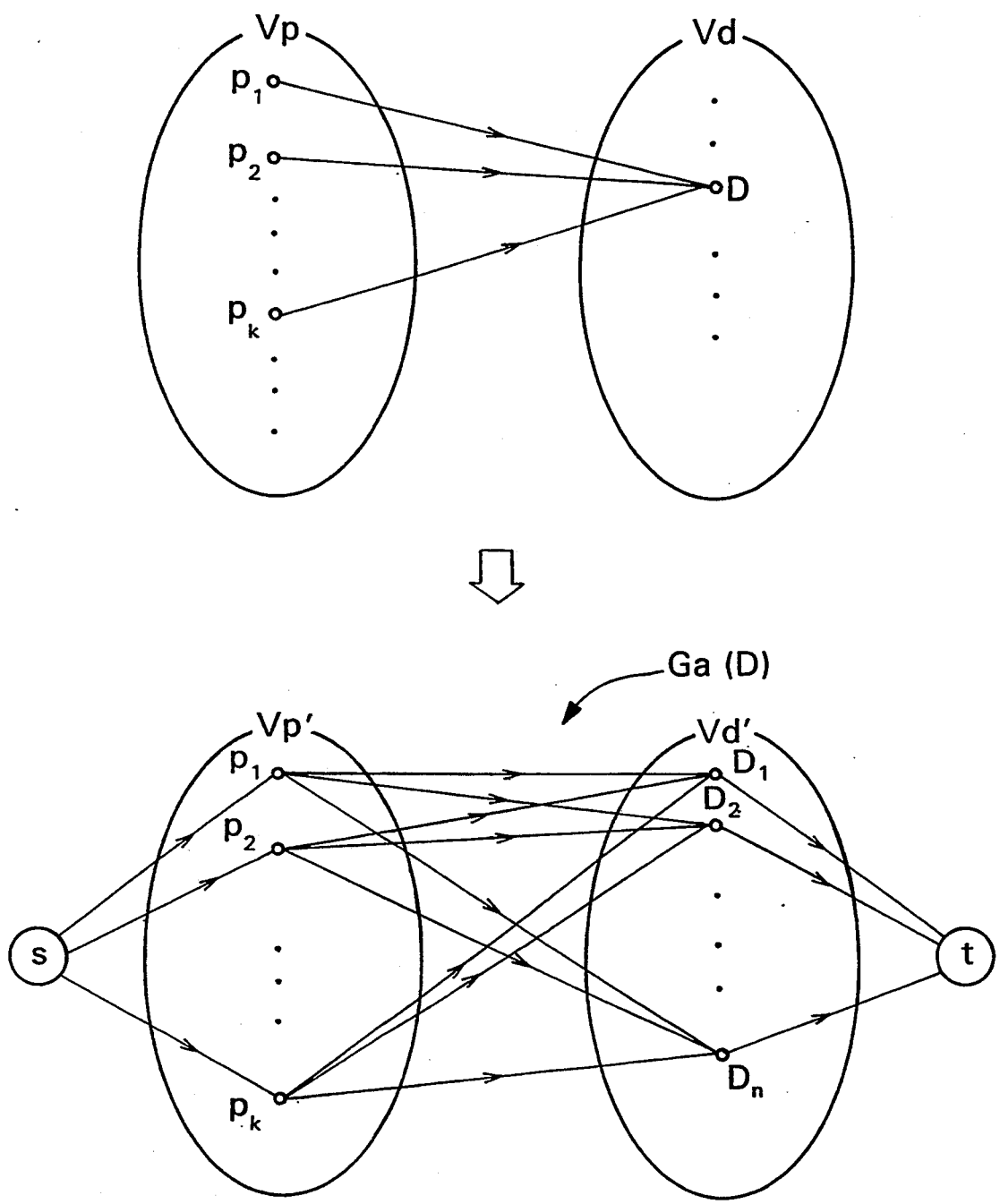
FIG. 11 is a diagram illustrating another wiring graph.

In the terminal fine assign means 3, the assignment of the terminals assigned to each division areas in a terminal assignment coordinate system is obtained. In the terminal fine assign means, the assignment of terminals is resolved in the solution of the minimum cost maximal integer flow problem in the directed graph, as in the terminal distribution assign means. Processes in respective division areas will be illustrated. A terminal assignment capacity in the division area D is indicated as N. Thereafter, the division area is divided into partial division areas $D_1, D_2, \ldots, D_N$. As shown in FIG. 11, with respect to a vertex set $V_p' = \{P_1, P_2, \ldots, p_k\}$ corresponding to the terminals assigned to the division area and a vertex set $V_d' = \{D_1, D_2, \ldots, D_N\}$ corresponding to the partial division area, a directed graph Ga(D) similar to that used in the terminal distribution assign means is prepared. In the graph Ga(D), the capacity $c(e_{jt})$ of directed edges $e_{jt} = (D_j, t)$ from each vertices of the set $V_d'$ to the vertex t are all set to 1. The cost added to a directed edge $e_{ij} = (p_i, D_j)$ is obtained as follows.

(1) When the initial assignment of the terminal p includes the division area D, the costs for allocating a terminal $p_i$ to all of the partial division areas $D_j$ are set to 1.

(2) When the division area D is horizontal and the initial assignment of the terminal $p_i$ is at the left (right) of the division area D, the costs assigned to the partial division areas $D_1, D_2, \ldots, D_N$ are designated as 1, 2, . . ., N in order from the left (right).

(3) When the division area D is vertical and the initial assignment of the terminal $p_i$ is at the upper (lower) of the division area D, the costs assigned to the partial division areas $D_1, D_2, \ldots, D_N$ are designated as 1, 2, . . ., N in order from the upper (lower).

(4) A process similar to that of (4) in the aforedescribed cost calculation in the terminal distribution assign means 2 is performed.

(5) A process similar to that of (5) in the aforedescribed cost calculation in the terminal distribution assign means 2 is performed.

Thereafter, in a manner similar to that in the terminal distribution assign means 2, the minimum cost maximal integer flow is obtained on the graph Ga(D), and each terminal $p_i$ is assigned to one of the partial division areas $D_1, D_2, \ldots, D_N$. Finally, according to the terminal position assigned in the partial division area, the terminal position is represented by a coordinate from 1 to 4,000.

When terminals to be assigned are bundle terminals, the following processes are executed. The bundle terminals are assigned in alignment so as to prevent the wiring from crossing in a bundle net. That is, an ascending (descending) flag is set in each bundle terminal by searching the wiring path obtained from the rough wiring. Then, a numeral in the parentheses included in the net name is set as the weight of each terminal, and the terminals are sorted in a ascending (descending) order of the weights according to the flags, thereby sequentially assigning the terminals.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A system for assigning positions of block terminals, said terminals being connected through wirings, said system comprising:
    initial terminal assign means for provisionally assigning terminal positions for the purpose of minimizing the total length of said wirings; and
    terminal distribution and assign means for evaluating said provisionally assigned terminal positions and for distributing said provisionally assigned terminal positions on the basis of said evaluation, said terminal distribution and assign means comprising:
    means for dividing an area at the periphery of each of said blocks into quantized areas;
    means for setting a first set of vertices which corresponds to a set of terminals of said block;
    means for setting a second set of vertices which corresponds to a set of said quantized areas;
    means for setting first directed edges from each of first vertices which belong to said first set to second vertices which belong to said second set and to which a terminal corresponding to said first vertex can be assigned, to each of which a cost is added, said cost being at a minimum when said terminal is assigned to said provisional terminal position, said cost increasing in accordance with one or more predetermined conditions;
    means for setting second directed edges from a third vertex to each of said first vertices, the flow capacity of said second directed edge being 1;
    means for setting third directed edges from each of said second vertices to a fourth vertex, the flow capacity of said third directed edge being the maximal number of terminals which can be assigned to said quantized area;
    means for determining a flow from said third vertex to said fourth vertex in which the flow is an integer, the cost is minimized, and the flow is maximized; and
    means for obtaining terminal assignment which corresponds to directed edges between said first vertices and said second vertices and having a flow of 1.

2. A system according to claim 1 wherein said system further comprises a terminal fine assign means for determining fine positions of said terminals.

3. A system according to claim 1 wherein said initial terminal assign means comprises:
    means for dividing an area for forming said wirings into quantized areas;
    means for representing the length of a wiring connecting equipotential terminals by the number of quantized areas through which said wiring passes; and
    means for minimizing the length of each wiring.

4. A system according to claim 1 wherein said predetermined conditions include one or more of the followings:
    the distance from said provisional terminal position;
    whether inside or outside the minimum rectangle which enclose a wiring between a set of equipotential terminals including said terminal;
    the number of bends of said wiring;
    the distance with respect to previously assigned one or more terminals of adjacent blocks which are connected equipotentially to said terminal; and
    whether on one edge of said block or on another edge, said one edge corresponding to said provisional terminal position.

5. A system for assigning positions of block terminals, said terminals being connected through wirings, said blocks being classified into one or more fixed shape blocks in which terminal positions are previously determined and one or more variable shape blocks in which terminal positions are changeable, said system comprising:
    initial terminal assign means for provisionally assigning terminal positions relating to said variable shape blocks, for the purpose of minimizing the total length of said wirings; and
    terminal distribution and assign means for evaluating said provisionally assigned terminal positions and for distributing said provisionally assigned terminal positions on the basis of said evaluation, said terminal distribution and assign means comprising:
    means for dividing an area at the periphery of each of said blocks into quantized areas;
    means for setting a first set of vertices which corresponds to a set of terminals of said block;
    means for setting a second set of vertices which corresponds to a set of said quantized areas;
    means for setting first directed edges from each of first vertices which belong to said first set to said second vertices which belong to said second set and to which a terminal corresponding to said first vertex can be assigned, to each of which a cost is added, said cost being at a minimum when said terminal is assigned to said provisional terminal position, said cost increasing in accordance with one or more predetermined conditions;
    means for setting second directed edges from a third vertex to each of said first vertices, the flow capacity of said second directed edge being 1;

means for setting third directed edges from each of said second vertices to a fourth vertex, the flow capacity of said third directed edge being the maximal number of terminals which can be assigned to said quantized area;

means for determining a flow from said third vertex to said fourth vertex in which the flow is an integer, the cost is minimized, and the flow is maximized; and means for obtaining terminal assignment which corresponds to directed edges between said first vertices and said second vertices and having a flow of 1.

6. A system according to claim 5 wherein said system further comprises a terminal fine assign means for determining fine positions of said terminals.

7. A system according to claim 5 wherein said initial terminal assign means comprises:
   means for dividing an area for forming said wirings into quantized areas;
   means for representing the length of a wiring connecting equipotential terminals by the number of quantized areas through which said wiring passes; and
   means for minimizing the length of each wiring.

8. A system according to claim 5 wherein said predetermined conditions includes one or more of the followings:
   the distance from said provisional terminal position;
   whether inside or outside the minimum rectangle which enclose a wiring between a set of equipotential terminals including said terminal;
   the number of bends of said wiring;
   the distance with respect to previously assigned one or more terminals of adjacent blocks which are connected equipotentially to said terminal; and
   whether on one edge of said block or on another edge, said one edge corresponding to said provisional terminal position.

9. A system for assigning positions of terminals of blocks, comprising:
   means for dividing an area at the periphery of each of said blocks into quantized areas;
   means for setting a first set of vertices which corresponds to a set of terminals of said block,
   means for setting a second set of vertices which corresponds to a set of said quantized areas;
   means for setting first directed edges from each of first vertices which belong to said first set to second vertices which belong to said second set, to each of which a cost is added, said cost representing a usefulness specification for assigning a terminal to a quantized area, the flow capacity of said first directed edge being 1;
   means for setting second directed edges from a third vertex to each of said first vertices, the flow capacity of said second directed edge being 1;
   means for setting third directed edges from each of said second vertices to a fourth vertex, the flow capacity of said third directed edge being the maximal number of terminals which can be assigned to said quantized area;
   means for determining a flow from said third vertex to said fourth vertex in which the flow is an integer, the cost is minimized, and the flow is maximized; and
   means for obtaining terminal assignment which corresponds to directed edges between said first vertices and said second vertices and having a flow of 1.

10. A method for automatically designing a layout for a semi-conductor device such as a VLSI, said method comprising the steps of:
   (i) positioning a terminal on the periphery of a rectangular block by a relative position of one dimension at a position j, where j is a real number, and the center of said block is represented by a real number a, said step (i) comprising the steps of:
      (i)-a selecting one of a first, second, third and fourth edge of said block on which to position said terminal;
      (i)-b provisionally positioning said terminal relative to said layout according to the following conditions:
         (a) when said first edge of said block is selected in step (i)-a, positioning said terminal such that said terminal is separated from one end of said first edge by $(j-a)/b$, where $a < j \leq a+b$, and b is a real number,
         (b) when said second edge of said block is selected in step (i)-a, positioning said terminal such that said terminal is separated from one end of said second edge connected to the other end of said first edge by $(j-a-b)/b$, where $a+b < j \leq a+2b$,
         (c) when said third edge of said block is selected in step (i)-a, positioning said terminal such that said terminal is separated from one end of said third edge connected to the other end of said second edge by $(j-a-2b)/b$, where $a+2b < j \leq a+3b$, and
         (d) when said fourth edge of said block is selected in step (i)-a, positioning said terminal such that said terminal is separated from one end of said fourth edge connected to the other end of said third edge by $(j-a-3b)/b$, where $a+3b < j \leq a+4b$;
   (ii) evaluating said provisional position of said terminal as a function of reducing chip area;
   (iii) repositioning said provisionally positioned terminal with respect to said layout relative to said selected one of said first, second, third and fourth edge of said block, based on said evaluating step; and
   (iv) placing a block terminal on said semi-conductor device at a position corresponding to said repositioned terminal relative to said layout, and connecting wires thereto.

* * * * *

UNITED STATES PATENT AND TRADEMARK OFFICE
CERTIFICATE OF CORRECTION

PATENT NO. : 5,404,313
DATED : April 4, 1995
INVENTOR(S) : Takahiro Shiohara et al.

It is certified that error appears in the above-indentified patent and that said Letters Patent is hereby corrected as shown below:

Column 6, line 58, "(1+K.C)" should read --(1+K·C)--.

Column 6, line 59, "K=1/(10.N), C=k.n.(W/$W_{min}$)" should read --K=1/(10·N), C=k·n·(W/$W_{min}$)--.

Column 7, line 6, "(b+K.C)" should read --(b+K·C)--.

Signed and Sealed this

Twelfth Day of December, 1995

Attest:

BRUCE LEHMAN

Attesting Officer

Commissioner of Patents and Trademarks